United States Patent [19]
Uto

[11] Patent Number: 6,102,788
[45] Date of Patent: Aug. 15, 2000

[54] SEMICONDUCTOR WAFER CARRIER STAGE FOR CHEMICAL MECHANICAL POLISHING APPARATUS

[75] Inventor: Mitsuyoshi Uto, Tokyo, Japan

[73] Assignee: NEC Corporation, Japan

[21] Appl. No.: 09/294,677

[22] Filed: Apr. 19, 1999

[30] Foreign Application Priority Data

Apr. 20, 1998 [JP] Japan .................................. 10-109920

[51] Int. Cl.⁷ .................................................. B24B 47/00
[52] U.S. Cl. ........................... 451/388; 451/288; 451/289
[58] Field of Search ................................. 451/41, 59, 63, 451/285, 287, 288, 289, 290, 385, 388, 398

[56] References Cited

U.S. PATENT DOCUMENTS

| | | |
|---|---|---|
| 3,004,766 | 10/1961 | Bryant . |
| 5,423,558 | 6/1995 | Koeth et al. . |
| 5,651,724 | 7/1997 | Kimura et al. . |
| 5,762,539 | 6/1998 | Nakashiba et al. . |
| 5,797,789 | 8/1998 | Tanaka et al. . |
| 5,931,725 | 8/1999 | Inaba et al. . |
| 5,938,512 | 8/1999 | Takei et al. . |

FOREIGN PATENT DOCUMENTS 767665   7/1995   Japan .

*Primary Examiner*—Timothy V. Eley
*Attorney, Agent, or Firm*—Hayes, Soloway, Hennessey, Grossman & Hage, P.C.

[57] ABSTRACT

A stage is provided with pressing holes arranged circumferentially and suctioning holes arranged circumferentially to be close to the outer peripheral edge side compared to the pressing holes. A cavity connected to these pressing holes and suctioning holes is provided within a wafer holder. In addition, first filters, which allow a gas to flow from the cavity side to the wafer holding surface side, are arranged between the pressing holes and the cavity. Second filters, which allow a gas to flow only from the wafer holding surface side to the cavity side, are arranged between the suctioning holes and the cavity.

18 Claims, 5 Drawing Sheets

SEMICONDUCTOR WAFER CARRIER STAGE FOR CHEMICAL MECHANICAL POLISHING APPARATUS

BACKGROUND OF THE INVENTION

1. Field of the Invention

The present invention relates to a chemical mechanical polishing apparatus used to transfer a wafer and to polish the surface of the wafer. The present invention relates to, in particular, a chemical mechanical polishing apparatus capable of enhancing workability in wafer transfer and uniformity in wafer polishing.

2. Description of the Related Art

Conventionally, various types of chemical mechanical polishing (to be referred to as 'CMP' hereinafter) apparatuses have been used for polishing a wafer surface. There has been proposed, for instance, a CMP apparatus capable of enhancing polishing accuracy by applying pressure to a wafer by a pressure fluid and pressing the wafer against a turning table with a uniform manner (in Japanese Patent Application Publication No. 7-67665).

FIG. 1A is a cross-sectional view showing a part of a conventional CMP apparatus and FIG. 1B is a plan view showing a wafer holding surface of the apparatus in FIG. 1A. FIG. 1A shows a condition in which a wafer is held on a wafer holder. As shown in FIGS. 1A and 1B, a back pad 23 is attached onto the back of a stage 22. The stage 22 and back pad 23 are provided with first gas holes 22a extending from the back pad 23 side in the direction perpendicular to the surface of the back pad 23 and with a cavity 22b connected to the first gas holes 22a. There is also provided a connection section 26 including the second gas hole 22c for suctioning a gas within the cavity 22b and/or supplying a gas into the cavity 22b on the upper wall portion of the stage 22. The connection section 26 is connected to a pump (not shown). As shown in FIG. 1B, the first gas holes 22a are arranged on a circle around the center of the back pad 23 and stage 22 and having about half the radius of that of the back pad 23 and stage 22.

Further, a holding ring 24 is disposed on the end faces of the stage 22 and back pad 23 to surround them. The holding ring 24 slightly protrudes downward from the surface of the back pad 23 and is designed to hold the peripheral edge surface of the wafer 25. A wafer holder 21 for the CMP apparatus is thereby constituted.

In wafer polishing, first, the wafer 25 is held within the holding ring 24 of the wafer holder 21 and then a vacuum pump connected to the connection section 26 is driven. Thus, the cavity 22b and the gas holes 22a are evacuated and the wafer 25 is vacuum-drawn on the back pad 23 which becomes a wafer holding surface. Next, while the wafer 25 is attached onto the back pad 23, the wafer 25 is transferred onto a turning table (not shown). A pressure pump connected to the connection section 26 is then driven, thereby pressing the wafer 25 against the surface of the turning table and subjecting the surface of the wafer 25 to CMP processing. Thereafter, the vacuum pump connected to the connection section 26 is driven again to thereby suction the wafer 25 onto the surface of the vacuum pad 23 and transfer the wafer 25 to a predetermined position.

As stated above, according to the conventional CMP apparatus, the suction and transfer of wafer 25 and the CMP processing for pressing the wafer 25 against the table are carried out on the same line using the gas holes 22a and the like provided in the wafer holder 21. The conventional apparatus is, thereby, designed to enhance workability in the transfer of the wafer 25 and performance in CMP processing, i.e., polishing uniformity.

However, in case of transferring and CMP processing the wafer 25 using the CMP apparatus including the above-stated wafer holder 21, the same gas holes 22a are used to suction and press the wafer 25. Due to this, appropriate suctioning conditions during transfer as well as appropriate pressure conditions for CMP processing are disadvantageously limited. The reasons are described as follows.

As shown in FIGS. 2A and 2B, it is assumed that gas holes 22d are formed close to the center of the stage compared with the gas holes 22a shown in FIGS. 1A and 1B. When the wafer 25 is pressed against the table 27, the center of the pressed wafer 25 is curved downward (concave-shaped) as shown in FIG. 3B. Thus, when CMP processing is conducted, polishing agent tends to enter between the table 27 and the wafer 25, with the result that the entire wafer 25 including the central portion thereof can be uniformly polished.

Meanwhile, if the wafer 25 is suctioned on the back pad 23 to transfer the wafer 25 once again after CMP processing, the center of the suctioned wafer 25 is curved upward (convex-shaped) as shown in FIG. 3A. At this moment, the surface of the wafer 25 has been smoothed as a result of the CMP processing and adhesion between the table 27 and the wafer 25 increases. Due to this, the suction force between the wafer holding surface and the wafer 25 is insufficiently low and the wafer 25 is often detached from the wafer holder 21. Transfer errors may occur, accordingly.

Further, as shown in FIGS. 4A and 4B, it is assumed that gas holes 22e are formed close to the peripheral edge side of the stage compared with the gas holes 22a shown in FIGS. 1A and 1B. If the wafer 25 is suctioned on the back pad 23, the peripheral edge portion of the suctioned wafer 25 is curved upward (concave-shaped) as shown in FIG. 5A. Due to this, the peripheral edge portion of the wafer 25 is suctioned after CMP processing, thereby making it possible to reduce adhesion between the table 27 and the wafer 25 and to prevent the occurrence of transfer errors.

In the meantime, if the wafer 25 is pressed against the table 27, the peripheral edge portion of the pressed wafer 25 is curved downward (convex-shaped) as shown in FIG. 5B. This makes it difficult for a polishing agent to enter between the table 27 and the wafer 25 during CMP processing. As a result, the surface of the wafer 25 is not polished uniformly.

As can be seen from the above, preferable conditions for suctioning the wafer 25 onto the wafer holder 21 differ from those for pressing the wafer 25 against the table 27. Normally, therefore, the gas holes 22a are arranged on a circle around the center of the back pad 23 and stage 22 and having about half the radius of that of the back pad 23 and stage 22 as shown in FIGS. 1A and 1B. By doing so, it is intended to overcome or reduce the problems shown in FIGS. 2A, 2B, 3A and 3B as well as those shown in FIGS. 4A, 4B, 5A and 5B. As a result, appropriate suctioning condition during transfer and appropriate pressure conditions during CMP processing are disadvantageously narrowed. Hence, workability in transfer and polishing uniformity in CMP processing cannot enhance further.

SUMMARY OF THE INVENTION

It is an object of the present invention to provide a CMP apparatus capable of enhancing workability in wafer transfer and capable of CMP processing the surface of the wafer in a uniform manner.

A chemical mechanical polishing apparatus according to the present invention is characterized by comprising: a stage having a wafer holding surface; pressing holes provided in the stage; suctioning holes provided in the stage, the suctioning holes arranged close to an outer peripheral edge side of the stage compared to the pressing holes; a pump connected to a cavity which is connected to the pressing holes and the suctioning holes at the opposite side of said wafer holding surface; first filters provided in a gas passage of the pressing holes and having a higher gas flow capacity in a direction in which a gas flows from said cavity to said wafer holding surface than a gas flow capacity in a direction opposite to that; and second filters provided in a gas passage of the suctioning holes and having a higher gas flow capacity in a direction in which the gas flows from said wafer holding surface to said cavity than a gas flow capacity in a direction opposite to that.

The first and second filters may include a plurality of particles, the particles upstream of the gas flow direction being larger in size than those downstream of the gas flow direction. The first filters allow the gas to flow in a pump pressing direction and the second filters allow the gas to flow in a pump suctioning direction.

Moreover, the pressing holes are preferably provided close to a center side of the stage with respect to circular positions of half a radius of that of the stage. The suctioning holes are preferably provided close to the outer peripheral edge portion side of the stage with respect to circular positions of half a radius of that of the stage.

According to the present invention, the first filters provided in the gas passage of the pressing holes have a higher gas flow capacity in the direction in which the gas flows from the cavity to the wafer holding surface than that in the opposite direction. The second filters provided in the gas passage of the suctioning holes have a higher gas flow capacity in the direction in which the gas flows from the wafer holding surface to the cavity than that in the opposite direction. Due to this, while the surface of the wafer is being polished, the pressure of the gas applied to the wafer through the pressing holes is higher than that applied to the wafer through the suctioning holes. Besides, the pressing holes are provided close to the center of the wafer holding surface compared to the suctioning holes. Owing to this, the center of the pressed wafer is curved downward, so that a polishing agent tends to enter between a turning table for polishing and the wafer from lateral direction and that it is possible to polish the entire wafer including the central portion thereof in a uniform manner.

Furthermore, after the surface of the wafer has been polished, the suctioning force of the gas suctioning the wafer through the suctioning holes is higher than that the wafer through the pressing holes due to the presence of the first and second filters. The holes are provided close to the outer peripheral edge side of the wafer holding surface compared to the pressing holes. Due to this, the peripheral edge portion of the suctioned wafer is curved upward (concave-shaped), so that adhesion between the turning table and the wafer can be reduced after polishing and that it is possible to prevent or reduce transfer errors from occurring.

According to the present invention, the filters are provided in the gas passages of the pressing holes and suctioning holes, respectively. The filters selectively determine the gas flow direction. Due to this, while the surface of the wafer is being polished, the center of the pressed wafer is curved downward and the entire wafer including the central portion thereof can be polished in a uniform manner. After polishing, the peripheral edge portion of the suctioned wafer is curved upward and, therefore, the occurrence of transfer errors can be prevented or reduced.

DESCRIPTION OF THE PREFERRED EMBODIMENTS

Figure 1A:
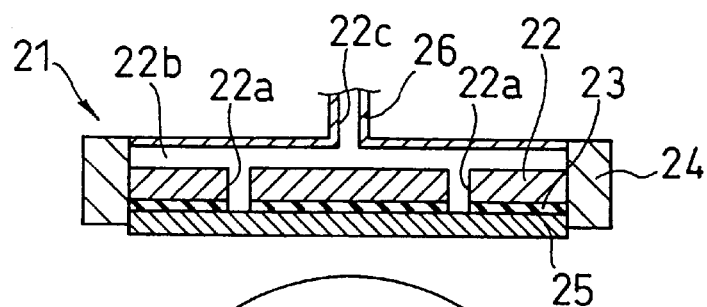
FIG. 1A is a cross-sectional view showing a part of a conventional CMP apparatus.
Figure 1B:
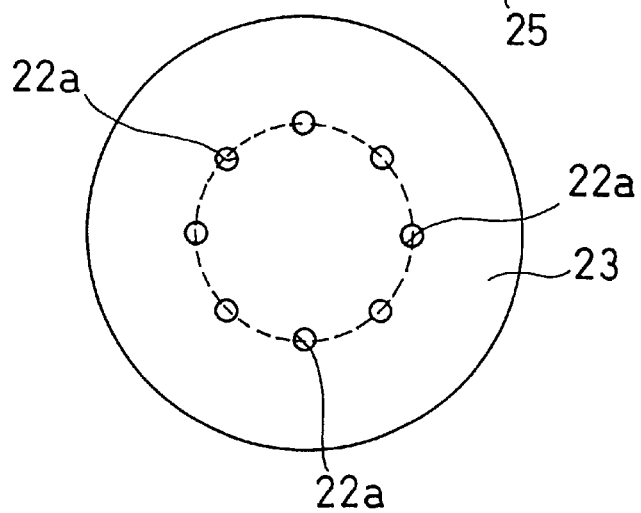
FIG. 1B is a plan view showing a wafer holding surface of the CMP apparatus.
Figure 2A:
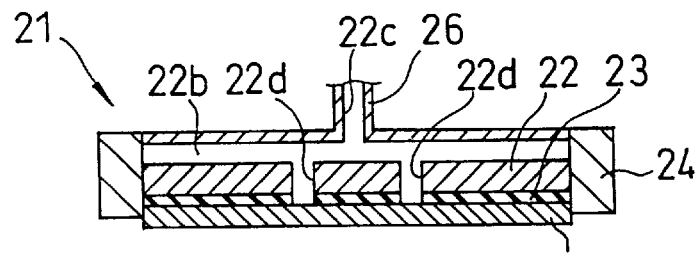
FIG. 2A is a cross-sectional view showing a part of a CMP apparatus provided with gas holes close to the center compared with gas holes shown in FIGS. 1A and 1B.
Figure 2B:
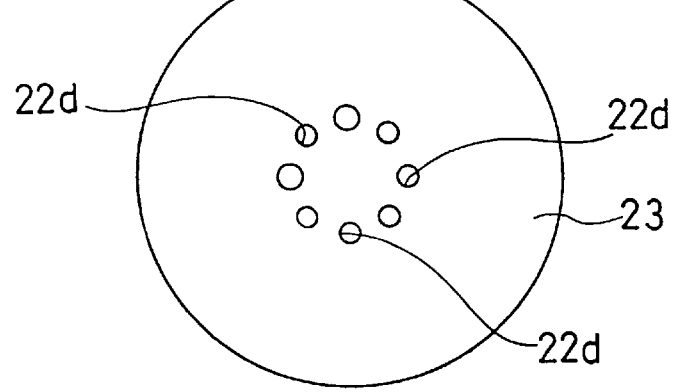
FIG. 2B is a plan view showing a wafer holding surface of the CMP apparatus.
Figure 3A:
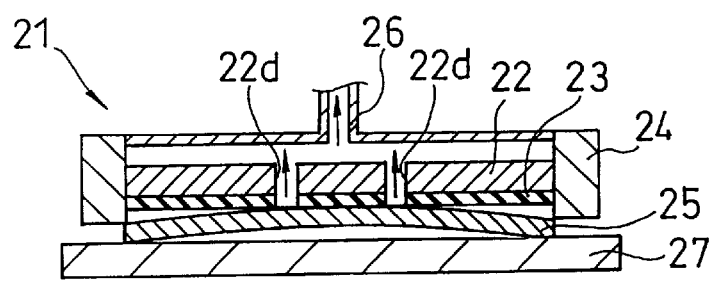
FIG. 3A is a cross-sectional view showing a state in which a wafer is suctioned using the CMP apparatus shown in FIGS. 2A and 2B.
Figure 3B:
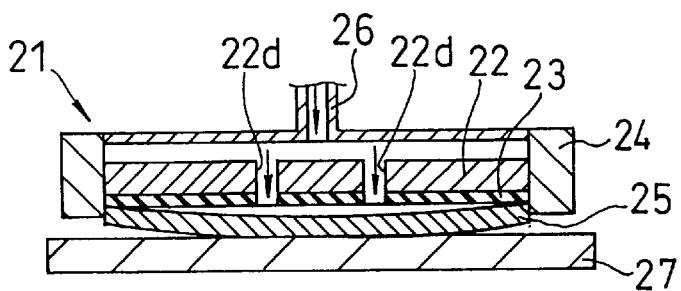
FIG. 3B is a cross-sectional view showing a state in which the wafer is pressed.
Figure 4A:
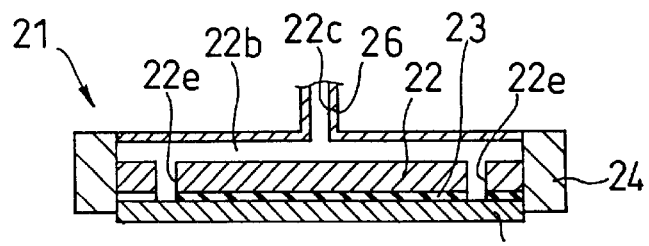
FIG. 4A is a cross-sectional view showing a part of a CMP apparatus provided with gas holes close to the outer peripheral edge side compared with the gas holes shown in FIGS. 1A and 1B.
Figure 4B:
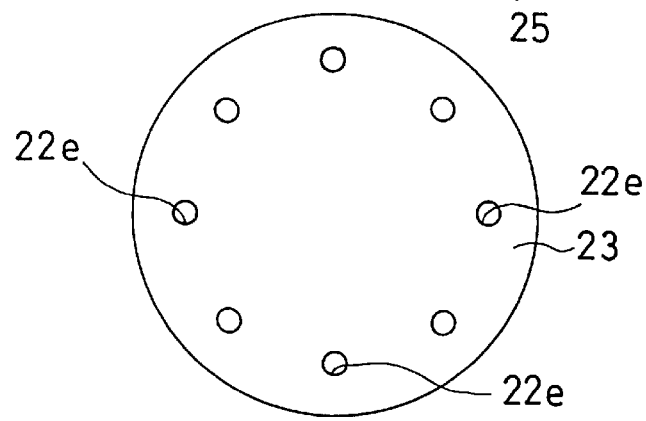
FIG. 4B is a plan view showing a wafer holding surface of the CMP apparatus.
Figure 5A:
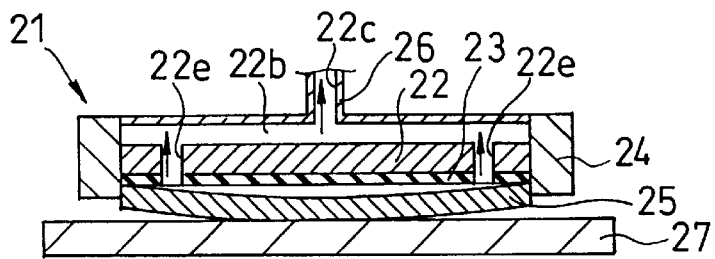
FIG. 5A is a cross-sectional view showing a state in which a wafer is suctioned using the CMP apparatus shown in FIGS. 4A and 4B.
Figure 5B:
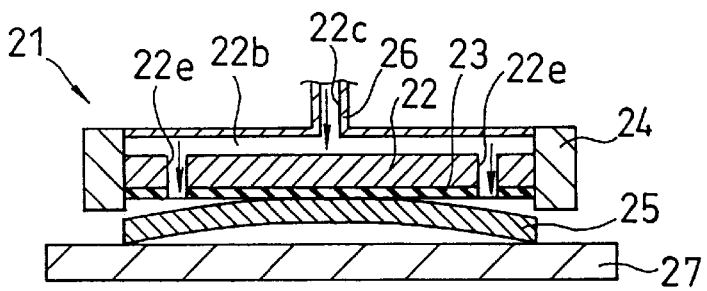
FIG. 5B is a cross-sectional view showing a state in which the wafer is pressed.
Figure 6A:
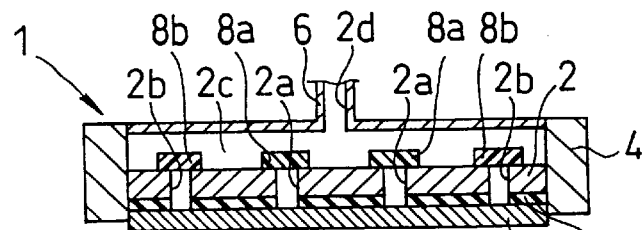
FIG. 6A is a cross-sectional view showing a part of a chemical mechanical polishing (CMP) apparatus in one embodiment according to the present invention.
Figure 6B:
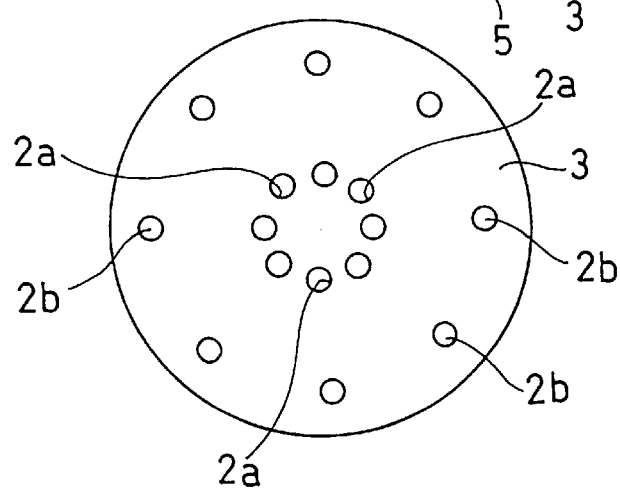
FIG. 6B is a plan view showing a wafer holding surface of the CMP apparatus.
Figure 7:
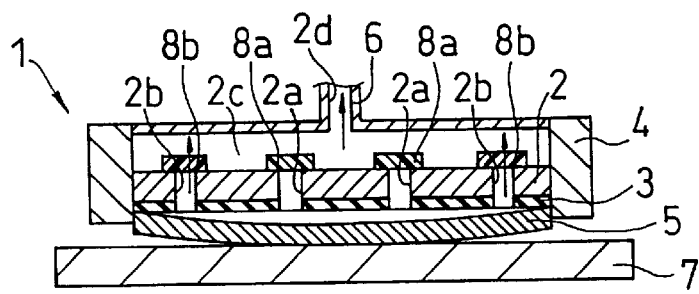
FIG. 7 is a cross-sectional view showing a state in which a wafer is suctioned.
Figure 8:
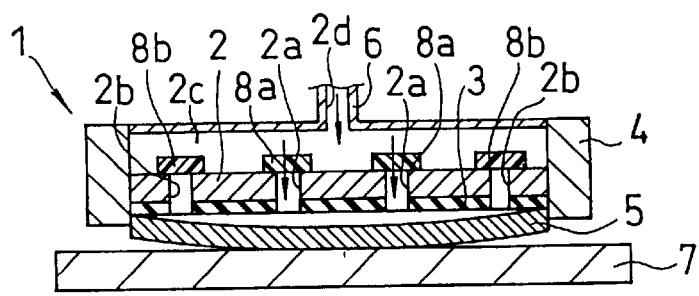
FIG. 8 is a cross-sectional view showing a state in which the wafer is pressed.

Now, detailed description will be given to a chemical mechanical polishing (to be referred to as 'CMP' hereinafter) apparatus of a preferred embodiment according to the present invention, with reference to the accompanying drawings. FIG. 6A is a cross-sectional view showing a part of the CMP apparatus in one embodiment according to the present invention. FIG. 6B is a plan view showing a wafer holding surface of the CMP apparatus. In addition, FIG. 7 is a cross-sectional view showing a state in which a wafer is suctioned. FIG. 8 is a cross-sectional view showing a state in which a wafer is pressed. It is noted that FIGS. 6A, 6B, 7 and 8 show a wafer holder in the CMP apparatus and that FIG. 6A shows a state in which a wafer is held on the wafer holder.

As shown in FIGS. 6A and 6B, a back pad 3 is attached onto the back surface of a stage 2 and the surface of the back pad 3 serves as a wafer holding surface. As shown in FIG. 6B, pressing holes 2a are provided circumferentially close to the center of the stage 2 and back pad 3 with respect to a circle drawn around the center thereof at about half the radius of the stage 2 and back pad 3. Suctioning holes 2b are provided circumferentially close to the outer peripheral edge portion of the stage 2 and back pad 3 with respect to a circle drawn around the center thereof at about half the radius the stage 2 and back pad 3. That is, the pressing holes 2a are provided in the vicinity of the central portion of the wafer holding surface in the direction perpendicular to the wafer holding surface, whereas the suctioning holes 2b are provided in the vicinity of the outer peripheral edge portion of the wafer holding surface in the direction parallel to the pressing holes 2a.

A cavity 2c is provided within the wafer holder 1 to be connected to these pressing holes 2a and suctioning holes 2b. Further, first filters 8a are arranged between the pressing holes 2a and the cavity 2c to allow gas to flow only from the cavity 2c side to the wafer holding surface side. Second filters 8b are arranged between the suctioning holes 2b and the cavity 2c to allow gas to flow only from the wafer holding surface side to the cavity 2c side.

Additionally, a connection section 6, which includes gas hole 2d to suction a gas within the cavity 2c and/or to supply the gas into the interior of the cavity 2c, is provided on the upper wall surface of the stage 2. The connection section 6 is connected to a pump (not shown). Also, a holding ring 4 is disposed on the end faces of the stage 2 and back pad 3 to surround them. The holding ring 4 slightly protrudes from the surface of the back pad 3 downward and is designed to hold the end face of the wafer 5. A wafer holder 1 in the CMP apparatus is thus constituted.

Figure 9:
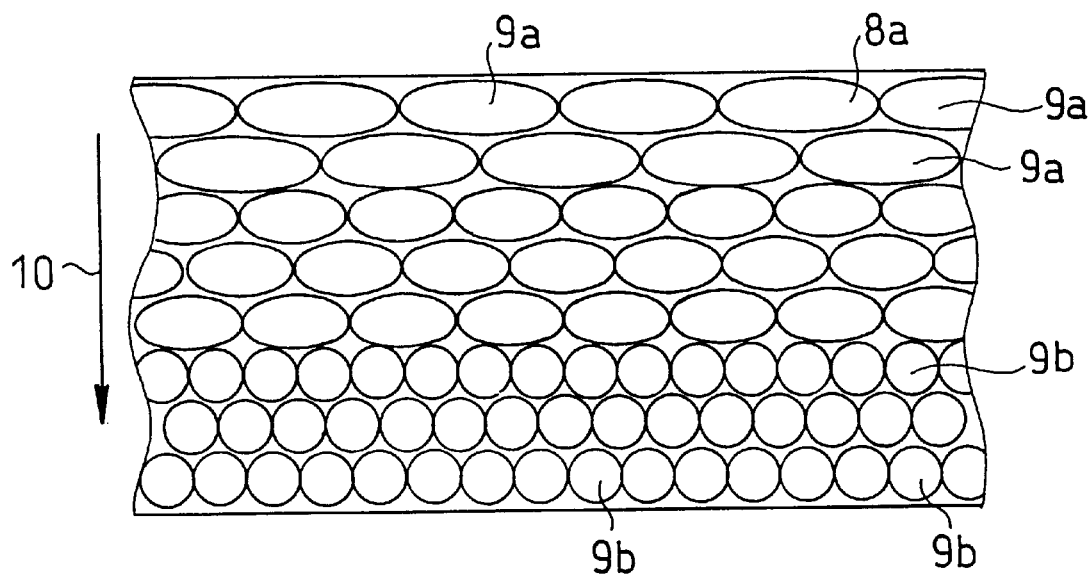
FIG. 9 is a typical view showing the structure of a filter used in the embodiment of the present invention.

As shown in FIG. 9, the first filter 8a, for instance, consists of a plurality of particles 9a and 9b of different sizes. The particles 9a upstream of the wafer pressing direction 10 are larger in size than the particles 9b downstream of the wafer pressing direction 10. This structure ensures that a gas can flow only from the cavity 2c side to the wafer holding surface side through the pressing holes 2a and not flow in the opposite direction.

Meanwhile, the second filter 8b may be arranged to be opposite to the vertical direction of the filter 8a shown in FIG. 9. That is, a filter which consists of a plurality of particles of different sizes, may be used as the second filter 8b. The filter 8b is provided such that smaller particles are arranged downstream of the wafer suctioning direction and that larger particles are arranged upstream of the wafer suctioning direction. This structure ensures that a gas can flow only from the wafer holding surface side to the cavity 2c side through the suctioning holes 2b and not flow in the opposite direction.

The wafer 5 is held by the wafer holder 1 of the above-stated arrangement. If the surface of the wafer 5 is to be polished, the wafer 5 is first held within the holding ring 4 of the wafer holder 1 and a vacuum pump connected to the connection section 6 is then driven. At this time, while a gas flows from the wafer holding surface side to the cavity 2c side through the suctioning holes 2b, the filters 2a suppress the gas from flowing from the wafer holding surface side to the cavity 2c side through the pressing holes 2a. Due to this, only the suctioning holes 2b are evacuated as shown in FIG. 7 and the peripheral edge portion of the wafer 5 is vacuum-suctioned. Next, while the wafer 5 is being suctioned, the wafer 5 is transferred onto a turning table (not shown).

Thereafter, a pressure pump connected to the connection section 6 is driven. At this moment, a gas flows from the cavity 2c side toward the wafer holding surface side through the pressing holes 2a, whereas the filters 8b suppress the gas from flowing from the cavity 2c side to the wafer holding surface side through the suctioning holes 2b. Owing to this, the gas compressed within the cavity 2c is discharged only from the pressing holes 2a. As shown in FIG. 8, therefore, a higher load is applied to the central portion of the wafer 5 than the peripheral edge portion thereof, and the wafer 5 is pressed against the surface of the turning table 7, thereby polishing the surface of the wafer 5. After that, the vacuum pump connected to the connection section 6 is driven again, whereby the peripheral edge portion of the wafer 5 is suctioned by the suctioning holes 2b and the wafer 5 is transferred to a predetermined position.

In this embodiment, if the wafer 5 is pressed against the table 7, the center of the pressed wafer 5 is curved downward (concave-shaped) as shown in FIG. 8. Due to this, a polishing agent tends to enter between the table 7 and the wafer 5, to thereby allow the entire wafer 5 including the central portion thereof to be polished in a uniform manner.

Furthermore, after chemical mechanical polishing processing is conducted, if the wafer 5 is suctioned to transfer the wafer 5 again, the peripheral edge portion of the wafer 5 is suctioned as shown in FIG. 7, so that the peripheral edge portion of the wafer 5 is curved upward (convex-shaped). This can reduce adhesion between the table 7 and the wafer 5 after the CMP processing and, therefore, to prevent or reduce transfer errors from occurring.

The first filters 8a and the second filters 8b used in this embodiment allow a gas to flow in one direction. Such filters as to have a gas flow capacity higher in one direction than a gas flow capacity in the opposite (the other) direction may be also used in the present invention. With these filters being used, if a gas flows through the filters, the flow of gas in one direction is easier than that in the opposite direction and selectivity can be thereby obtained. Hence, the same advantage as in this embodiment can be provided.

What is claimed is:

1. A chemical mechanical polishing apparatus comprising:
   a stage having a wafer holding surface side;
   pressing holes provided in said stage;
   suctioning holes provided in said stage, said suctioning holes being arranged close to an outer peripheral edge of said stage compared to said pressing holes;
   a pump connected to a cavity which is connected to said pressing holes and said suctioning holes at a side of said wafer opposite to said holding surface side;
   first filters provided in a gas passage of said pressing holes and having a higher gas flow capacity in a direction from said cavity to said wafer holding surface than a gas flow capacity in a direction opposite to that; and
   second filters provided in a gas passage within said suctioning holes and having a higher gas flow capacity in a direction from said wafer holding surface to said cavity than a gas flow capacity in a direction opposite to that.

2. The chemical mechanical polishing apparatus according to claim 1, wherein said first and second filters include a plurality of particles, said particles upstream of the direction of said gas flow being larger in size than those downstream of the direction of said gas flow.

3. The chemical mechanical polishing apparatus according to claim 2, wherein said first filters allow a gas to flow in a pump pressing direction and said second filters allow a gas to flow in a pump suctioning direction.

4. The chemical mechanical polishing apparatus according to claim 3, wherein said pressing holes are provided close to a center of said stage with respect to a circle drawn at half a radius of that of said stage.

5. The chemical mechanical polishing apparatus according to claim 4, wherein said suctioning holes are provided close to the outer peripheral edge of said stage with respect to a circle drawn at half a radius of that of said stage.

6. The chemical mechanical polishing apparatus according to claim 3, wherein said suctioning holes are provided close to the outer peripheral edge of said stage with respect to a circle drawn at half a radius of that of said stage.

7. The chemical mechanical polishing apparatus according to claim 2, wherein said pressing holes are provided close to a center of said stage with respect to a circle drawn at half a radius of that of said stage.

8. The chemical mechanical polishing apparatus according to claim 7, wherein said suctioning are provided close to the outer peripheral edge of said stage with respect to a circle drawn at half a radius of that of said stage.

9. The chemical mechanical polishing apparatus according to claim 2, wherein said suctioning holes are provided close to the outer peripheral edge of said stage with respect to a circle drawn at half a radius of that of said stage.

10. The chemical mechanical polishing apparatus according to claim 1, wherein said first filters allow a gas to flow in a pump pressing direction and said second filters allow a gas to flow in a pump suctioning direction.

11. The chemical mechanical polishing apparatus according to claim 2, wherein said pressing holes are provided close to a center of said stage with respect to a circle drawn at half a radius of that of said stage.

12. The chemical mechanical polishing apparatus according to claim 11, wherein said suctioning holes are provided close to the outer peripheral edge of said stage with respect to a circle drawn at half a radius of that of said stage.

13. The chemical mechanical polishing apparatus according to claim 10, wherein said suctioning holes are provided close to the outer peripheral edge of said stage with respect to a circle drain at half a radius of that of said stage.

14. The chemical mechanical polishing apparatus according to claim 1, wherein said pressing holes are provided close to a center of said stage with respect to a circle drawn at half a radius of that of said stage.

15. The chemical mechanical polishing apparatus according to claim 14, wherein said suctioning holes are provided close to the outer peripheral edge of said stage with respect to a circle drawn at half a radius of that of said stage.

16. The chemical mechanical polishing apparatus according to claim 1, wherein said suctioning holes are provided close to the outer peripheral edge of said stage with respect to a circle drawn at half a radius of that of said stage.

17. The chemical mechanical polishing apparatus according to claim 1, and further including a pad provided on said wafer holding surface.

18. The chemical mechanical polishing apparatus according to claim 1, and further comprising a holding ring attached to a peripheral edge surface of said stage, for surrounding said wafer on the peripheral edge surface thereof.

* * * * *